(12) United States Patent
Chang et al.

(10) Patent No.: US 6,797,552 B1
(45) Date of Patent: Sep. 28, 2004

(54) METHOD FOR DEFECT REDUCTION AND ENHANCED CONTROL OVER CRITICAL DIMENSIONS AND PROFILES IN SEMICONDUCTOR DEVICES

(75) Inventors: Mark S. Chang, Los Altos, CA (US); Douglas J. Bonser, Austin, TX (US); Marina V. Plat, San Jose, CA (US); Chih Yuh Yang, San Jose, CA (US); Scott A. Bell, San Jose, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/299,434

(22) Filed: Nov. 19, 2002

(51) Int. Cl.[7] .................. H01L 21/336; H01L 21/8234; H01L 21/302; H01L 21/461
(52) U.S. Cl. ................. 438/197; 438/717; 438/719; 438/735
(58) Field of Search ............................... 438/197, 717, 438/719, 736, 151

(56) References Cited

U.S. PATENT DOCUMENTS 6,080,529 A * 6/2000 Ye et al. ..................... 430/318
6,316,348 B1 * 11/2001 Fu et al. ..................... 438/636
2002/0001778 A1 * 1/2002 Latchford et al. .......... 430/313

OTHER PUBLICATIONS

Stanley Wolf Ph.D. and Richard N. Tauber Ph.D. in Silicon Processing for the VLSI Era, vol. 1: Process Technology, Lattice Press, 1986, pp. 144–7.*

* cited by examiner

Primary Examiner—William M. Brewster
(74) Attorney, Agent, or Firm—Foley & Lardner LLP

(57) ABSTRACT

A layer of material is patterned anisotropically using a bi-layer hardmask structure. Residual photoresist from a photoresist mask used to pattern an upper layer of the bi-layer hardmask is removed prior to patterning of the polysilicon layer. Passivation agents are later introduced from an external source during patterning of the layer of material. This provides a substantially uniform supply of passivation agents to all parts of the layer of material as it is being etched, rather than relying on the generation of passivation agents from consumption of photoresist during etching, which can produce local non-uniformities of passivation agent availability owing to differences in photoresist thickness remaining on different sized features.

8 Claims, 4 Drawing Sheets

METHOD FOR DEFECT REDUCTION AND ENHANCED CONTROL OVER CRITICAL DIMENSIONS AND PROFILES IN SEMICONDUCTOR DEVICES

BACKGROUND OF THE INVENTION

1. Field of the Invention

Embodiments of the present invention relate to semiconductor fabrication, and in particular, to methods for reducing semiconductor device defects and enhancing control over semiconductor device geometries and profiles.

2. Background Technology

Current semiconductor device patterning techniques commonly employ a bi-layer antireflective hardmask structure for patterning an underlying layer. FIG. 1a shows an example of such a structure. In this structure, a semiconductor substrate 10 has formed thereon a silicon oxide gate insulating layer 12 and a polysilicon gate conductive layer 14 that is to be patterned to form a MOSFET gate line. Formed over the gate conductive layer 14 are an antireflective amorphous carbon layer 16, a silicon oxynitride (SiON) capping layer 18, and a photoresist mask including mask portions 20a and 20b. In conventional processing, the photoresist mask pattern is transferred to the SiON layer 18 using a fluorine or chlorine etch chemistry. The pattern is then transferred to the amorphous carbon layer 16 using an oxygen etch chemistry. Finally the pattern is transferred to the polysilicon layer 14 using a fluorine etch chemistry. Because of their similar etch chemistries, the etch of the amorphous carbon typically consumes a portion of the photoresist mask, and the etch of the polysilicon typically consumes a portion of the SiON capping layer.

In the conventional process, anisotropic etching of the polysilicon layer is achieved in part as the result of passivation agents that are released by consumption of the photoresist material during etching of the polysilicon. As shown in FIG. 1b, during etching of the polysilicon layer 14, passivation agents such as nitrogen and carbon enter the atmosphere from the photoresist as it is consumed by the etch and are subsequently deposited on the newly etched sidewalls of the polysilicon layer, where they retard further inward etching and thus contribute to the creation of a vertical sidewall profile. However, as seen in FIG. 1b, the amount of photoresist that remains at a given location at this stage of processing depends on the width of the feature being patterned. For example, in the structure of FIG. 1b, the photoresist mask portion 20b overlying a wide feature remains relatively thick during polysilicon patterning, while the photoresist mask portion 20a overlying a narrower feature is almost completely consumed while a significant amount of polysilicon remains to be patterned. Because the passivation of the polysilicon layer by photoresist components is a highly localized phenomenon, once the photoresist mask portion 20a overlying the narrow feature is consumed, the passivation effect is diminished at that location. Therefore control of profiles becomes more difficult as the dimensions of the features to be patterned are reduced.

Consequently, there is a need for further techniques to reduce patterning defects and to enhance control over device geometries and profiles.

SUMMARY OF THE INVENTION

It is therefore an object of the present invention to provide a method of patterning materials such as polysilicon using a bi-layer hardmask in a manner such that profile control is less dependent on the dimensions of the patterned feature.

In accordance with a preferred embodiment of the invention, a photoresist mask is removed from the upper layer of a bi-layer hardmask structure prior to patterning of a polysilicon layer that underlies the bi-layer hardmask structure. Passivation agents are introduced by way of source gasses during etching of the polysilicon, rather than relying on residual photoresist as a source of passivation agents. In this manner control over of patterned features is made less dependent on feature size because the passivation agent concentration at a given location is not dependent on localized photoresist availability.

In accordance with one embodiment of the invention, a semiconductor device is fabricated. Initially a substrate is provided. The substrate has formed thereon a polysilicon layer, a lower hardmask layer, such as amorphous carbon, and an upper hardmask layer, such as SiON. A photoresist mask is then formed on the upper hardmask layer. The upper hardmask layer is then patterned using the photoresist mask as an etch mask to form an upper hardmask. The photoresist mask is then removed from the upper hardmask layer in situ. The lower hardmask layer is patterned using the upper hardmask as an etch mask to form a lower hardmask, and the polysilicon layer is then patterned anisotropically using the lower hardmask as an etch mask while introducing a passivation agent into the chamber from an external source. The patterning of the polysilicon does not utilize any passivation agents emitted from photoresist during patterning since the photoresist was removed at an earlier stage. Therefore greater control over profiles and critical dimensions is provided.

In accordance with other embodiments of the invention, a different patternable material may be patterned using an analogous technique. Such materials include dielectric materials such as silicon oxide and metals such as aluminum.

DESCRIPTION OF THE DRAWINGS

Preferred embodiments of the invention will hereafter be described with reference to the accompanying drawings, wherein like numerals denote like elements, and in which.

DETAILED DESCRIPTION OF PREFERRED EMBODIMENTS

Figure 1A:
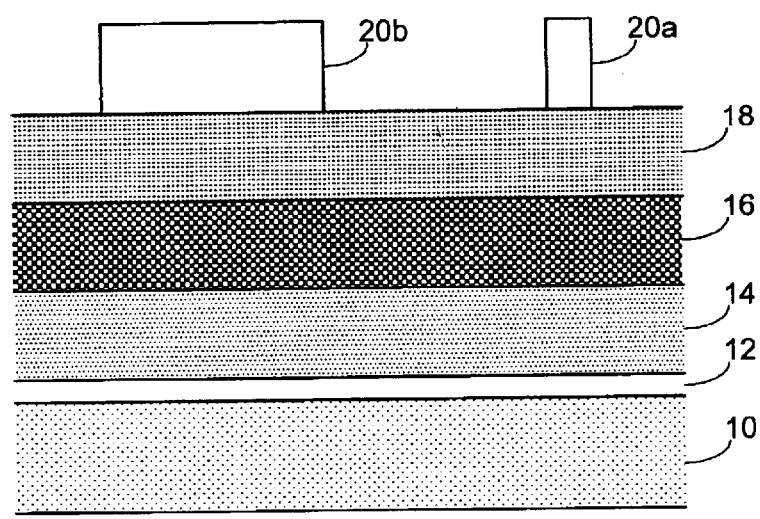
FIGS. 1a and 1b show structures formed during processing in accordance with a conventional method.
Figure 1B:
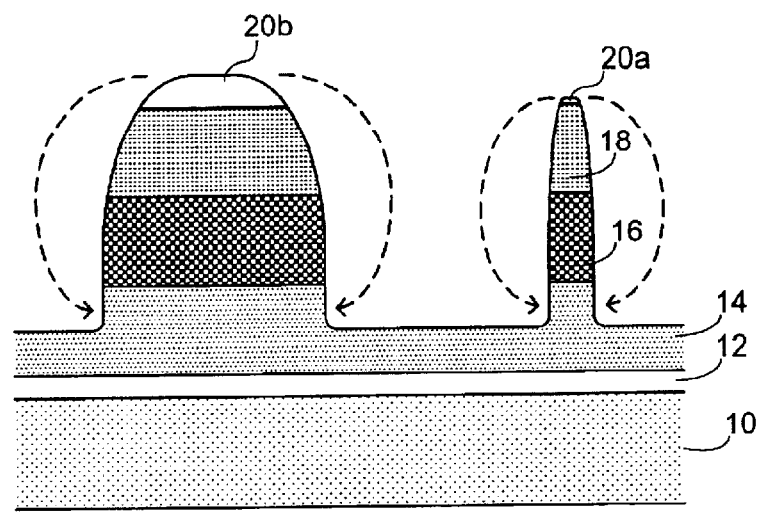
Figure 2A:
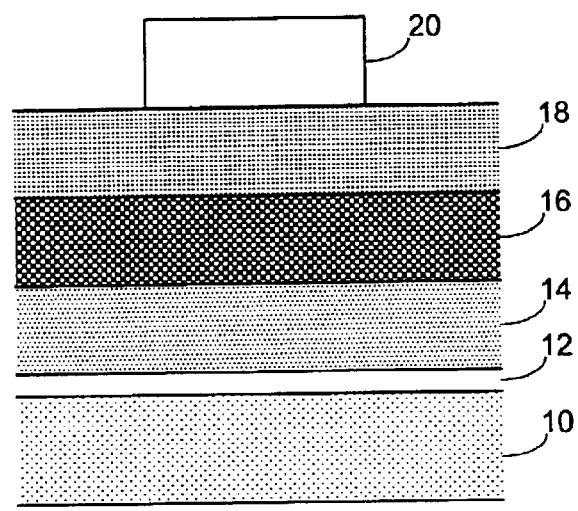
FIGS. 2a, 2b, 2c, 2d, 2e and 2f show structures formed during processing in accordance with a preferred embodiment.

FIGS. 2a–2f show structures formed during processing in accordance with a preferred embodiment. FIG. 2a shows a semiconductor substrate 10 on which is formed a silicon oxide gate insulating layer 12 and a polysilicon gate conductive layer 14. Formed over the gate conductive layer 14 are an amorphous carbon lower hardmask layer 16, a SiON upper hardmask or capping layer 18, and a photoresist mask 20 that defines a pattern to be transferred to the polysilicon gate conductive layer 14 to form a MOSFET gate line. The geometry of the photoresist mask may be reduced by isotropic trimming prior to any patterning of underlying layers. This enables the patterning of features that are smaller than the feature size originally formed in the photoresist mask. Thus, for example, a feature patterned in the polysilicon layer 14 may be made narrower than the narrowest feature size that can be provided in a photoresist mask.

Figure 2B:
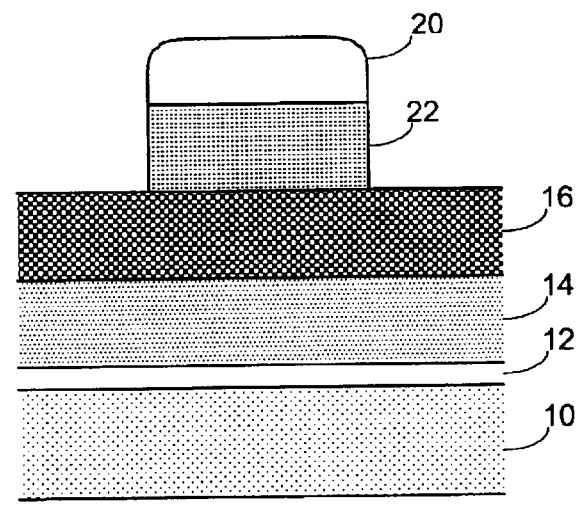

FIG. 2b shows the structure of FIG. 2a after etching of the SiON upper hardmask layer using a fluorine or fluorine/chlorine etch chemistry to pattern the SiON layer to form an upper portion 22 of a bi-layer hardmask. After completion of this stage of processing a significant portion of the photoresist mask 20 remains on the SiON upper portion 22.

Figure 2C:
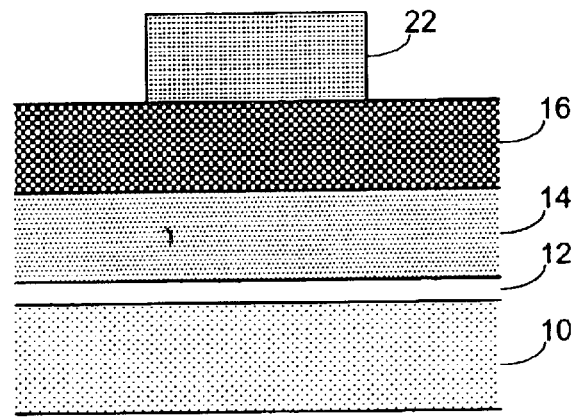

FIG. 2c shows the structure of FIG. 2b after use of an isotropic oxygen etch to remove all photoresist. This procedure is typically performed in situ. In other words, the removal of photoresist is preferably performed in the same chamber as the etching of the SiON upper hardmask layer. Typically the oxygen etch will also consume a small amount of any exposed surface of the amorphous carbon layer 16, however the parameters of the etch may be chosen so that the amount of consumed amorphous carbon is negligible.

Figure 2D:
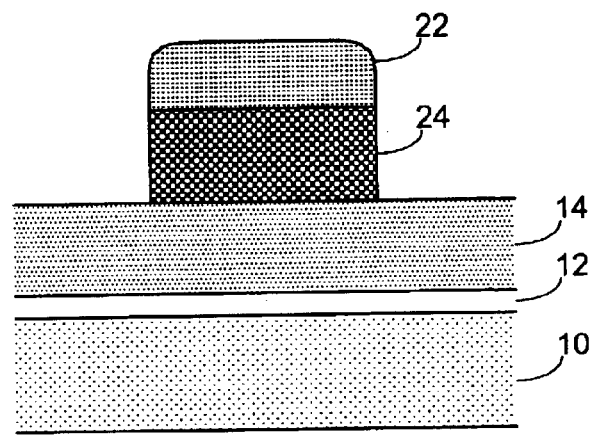

FIG. 2d shows the structure of FIG. 2c after etching of the amorphous carbon layer using an oxygen or HBr or chlorine etch chemistry to pattern the amorphous carbon layer to form a lower portion 24 of a bi-layer hardmask.

Figure 2E:
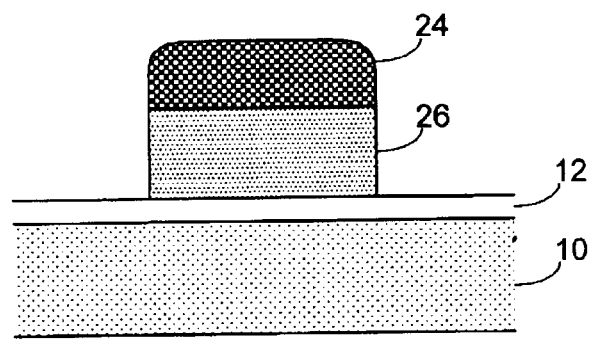

FIG. 2e shows the structure of FIG. 2d after a brief etch of the polysilicon layer using a fluorine chemistry containing one or more of HBr and chlorine to remove any surface oxide, followed by a further etch using a chlorine chemistry containing HBr and preferably oxygen to pattern a gate line 26 from the polysilicon layer. This etch chemistry is highly selective of the SiON hardmask material with respect to the silicon oxide gate insulating layer 12, enabling the etch to be conducted for a time sufficient to consume the upper SION portion of the bi-layer hardmask without causing significant damage to exposed portions of the gate insulating layer 12. The HBr included in the etch chemistry provides passivation agents for passivating the polysilicon gate 26 sidewalls to improve the profile control of the etch process. By introducing passivation agents into the chamber from an external source in this manner, a sufficiently consistent supply of passivation agents is provided to all areas of the wafer, thus improving profile control and making profile control less dependent on the size of the feature being patterned. In other words, by eliminating the use of irregularly distributed residual photoresist as a source of passivation agents and providing an etch atmosphere with an essentially uniform passivation agent content, greater control over profiles and is provided.

Figure 2F:
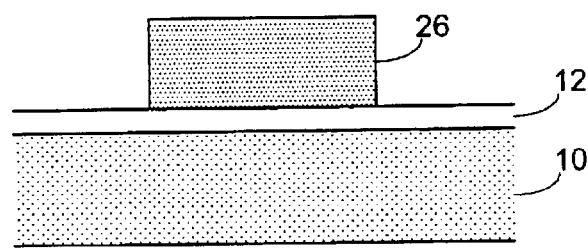

FIG. 2f shows the structure of FIG. 2e after exposure to an oxygen atmosphere to consume the amorphous carbon portion of the bi-layer hardmask, a process sometimes referred to as ashing. Ashing may also be performed in a hydrogen atmosphere. Ashing in an oxygen atmosphere has the benefit of forming a thin protective layer of oxide on the gate line 26. In some instances, the gate insulating layer is thereafter patterned, such as by a wet dip in an etchant such as dilute HF, or a buffered oxide etch (BOE), or the gate insulating layer may be left intact. Other features of a MOSFET device may then be formed, including shallow source and drain extensions implanted on opposing sides of the gate, offset spacers formed around the gate, deep source and drain regions implanted on opposing sides of the gate, and silicides formed in the source and drain regions and on the gate.

While the processing shown in FIGS. 2a–2f is presently preferred, a variety of alternatives may be implemented. For example, the process need not be used to pattern a polysilicon gate line, but may be used to pattern other polysilicon structures. In various further embodiments, other materials may be patterned in a similar manner. Examples of such materials include dielectric materials such as silicon oxide, and metals such as aluminum. In conjunction with the patterning of materials other than polysilicon, it may be preferred to use alternative combinations of materials for the layers of the bi-layer hardmask. For example, an alternative bi-layer hardmask may comprise a layer of silicon nitride or silicon oxynitride overlying a layer of silicon oxide. The selection of materials for the bi-layer hardmask will be determined in part by the antireflective properties that can be obtained by selecting appropriate upper and lower materials and respective thicknesses. The selection of materials will also be determined in part by the etch selectivities of the materials with respect to each other and with respect to the underlying material to be patterned.

In further embodiments, additional processing may be performed to reduce the dimensions of features being formed by this processing. For example, the dimensions of a photoresist mask may be trimmed prior to patterning of an underlying hardmask in order to reduce the dimensions of the patterned features in the hardmask and the underlying patternable layer.

Figure 3:
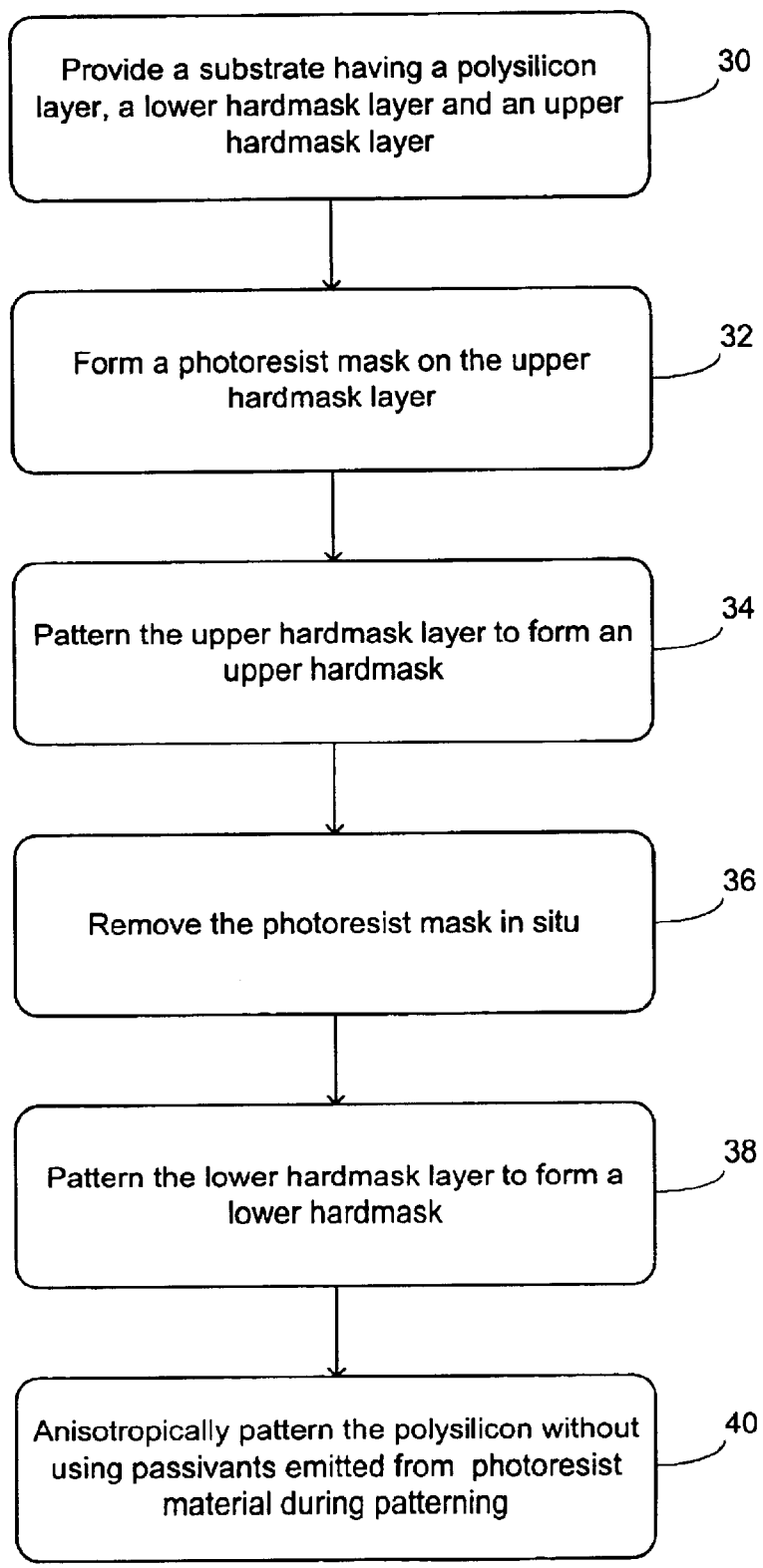
FIG. 3 shows a process flow encompassing the preferred embodiment and alternative embodiments.

Accordingly, a wide variety of embodiments may be implemented. FIG. 3 shows a process flow encompassing the preferred embodiments and the aforementioned alternatives, as well as other alternatives. Initially a substrate is provided (30). The substrate has formed thereon a patternable layer, a lower hardmask layer, such as amorphous carbon, and an upper hardmask layer, such as SiON. A photoresist mask is then formed on the upper hardmask layer (32). The upper hardmask layer is then patterned using the photoresist mask as an etch mask to form an upper hardmask (34). The photoresist mask is then removed from the upper hardmask layer (36). The lower hardmask layer is patterned using the upper hardmask as an etch mask to form a lower hardmask (38), and the patternable layer is then patterned anisotropically using the lower hardmask as an etch mask while introducing passivation agents from an external source (40). The patterning does not utilize any passivation agents emitted from photoresist during patterning since the photoresist was removed at an earlier stage. Therefore greater control over profiles and critical dimensions is provided.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a semiconductor device comprising:

providing a substrate having formed thereon a polysilicon layer, a lower amorphous carbon hardmask layer formed on the polysilicon layer, and an upper silicon oxynitride hardmask layer formed on the lower amorphous carbon hardmask layer;

forming a photoresist mask on the upper silicon oxynitride hardmask layer;

patterning the upper silicon oxynitride hardmask layer using the photoresist mask as an etch mask to form an upper hardmask;

removing the photoresist mask;

patterning the lower amorphous carbon hardmask layer using the upper hardmask as an etch mask to form a lower hardmask; and anisotropically patterning the polysilicon layer using the lower hardmask as an etch mask while introducing a source of passivation agents from an external source, wherein said patterning of the polysilicon layer does not utilize passivation agents emitted from a photoresist material during patterning of the polysilicon layer.

2. The method claimed in claim 1, wherein anisotropically patterning the polysilicon comprises:

etching the polysilicon using a fluorine chemistry to remove oxide from a surface of the polysilicon; and etching the polysilicon using a chlorine chemistry, and wherein the passivation agent introduced from an external source comprises HBr.

3. The method claimed in claim 1, wherein the upper silicon oxynitride hardmask layer is etched with fluorine.

4. The method claimed in claim 1, wherein the upper silicon oxynitride hardmask layer is etched with a combination of fluorine and chlorine.

5. The method claimed in claim 1, wherein patterning the upper silicon oxynitride hardmask layer is preceded by trimming the photoresist mask by an isotropic etch.

6. The method claimed in claim 1, wherein removing the photoresist layer is performed in situ using an oxygen chemistry.

7. The method claimed in claim 1, wherein the lower amorphous carbon hardmask layer is etched with an oxygen chemistry.

8. The method claimed in claim 1, wherein patterning the polysilicon layer consumes said upper silicon oxynitride hardmask.

* * * * *